US010396783B2

(12) United States Patent
Chan

(10) Patent No.: US 10,396,783 B2
(45) Date of Patent: Aug. 27, 2019

(54) OPTICAL MODULE, MANUFACTURING METHOD THEREOF AND ELECTRONIC APPARATUS

(71) Applicant: Advanced Semiconductor Engineering, Inc., Kaohsiung (TW)

(72) Inventor: Hsun-Wei Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/947,177

(22) Filed: Nov. 20, 2015

(65) Prior Publication Data

US 2016/0146639 A1 May 26, 2016

(30) Foreign Application Priority Data

Nov. 20, 2014 (CN) .......................... 2014 1 0673430

(51) Int. Cl.
*G01S 7/481* (2006.01)
*H03K 17/945* (2006.01)
(Continued)

(52) U.S. Cl.
CPC .......... *H03K 17/945* (2013.01); *G01S 7/4813* (2013.01); *G01S 17/026* (2013.01);
(Continued)

(58) Field of Classification Search
CPC ........ H03K 17/945; H03K 2217/94108; G01S 17/026; G01S 7/4813;
(Continued)

(56) References Cited

U.S. PATENT DOCUMENTS 4,309,605 A * 1/1982 Okabe ...................... G01V 8/12 250/239
8,097,852 B2 * 1/2012 Yao ...................... G01S 7/4813 250/338.1
(Continued)

FOREIGN PATENT DOCUMENTS

CN 1538538 A 10/2004
CN 102956625 A 3/2013
(Continued)

OTHER PUBLICATIONS

Office Action dated Sep. 19, 2016, including Search Report, for Taiwan Patent Application No. 104138599, and English Translation of Search Report, 7 pages total.
(Continued)

*Primary Examiner* — Jarrett J Stark
(74) *Attorney, Agent, or Firm* — Foley & Lardner LLP; Cliff Z. Liu

(57) ABSTRACT

An optical module includes a substrate, a lid, a light-emitting component, a first sensor and a second sensor. The lid is disposed on a surface of the substrate. The lid defines a first opening, a second opening and a third opening. The second opening is between the first opening and the third opening. The light-emitting component is disposed on the surface of the substrate and in the first opening. The first sensor is disposed on the surface of the substrate and in the second opening. The second sensor is disposed on the surface of the substrate and in the third opening.

28 Claims, 9 Drawing Sheets

(51) Int. Cl.

| | |
|---|---|
| ***G01S 17/02*** | (2006.01) |
| *H01L 51/44* | (2006.01) |
| *H01L 31/0203* | (2014.01) |

(52) U.S. Cl.
CPC ........ *H01L 31/0203* (2013.01); *H01L 51/448* (2013.01); *H01L 2224/48091* (2013.01); *H03K 2217/94108* (2013.01)

(58) Field of Classification Search
CPC ...... G01S 7/481–7/4815; G01S 7/4811; H01L 31/0203; H01L 51/448; H01L 23/32; H01L 23/562–576; H01L 23/552–556; H01L 23/3142; H01L 25/075–0756; H01L 25/13; H01L 25/16–167; H01L 25/18
See application file for complete search history.

(56) References Cited

U.S. PATENT DOCUMENTS

| | | | | | |
|---|---|---|---|---|---|
| 8,143,608 | B2 * | 3/2012 | Yao | G01S 7/4813 | 250/239 |
| 8,232,883 | B2 * | 7/2012 | Yao | G01J 1/02 | 340/600 |
| 8,362,496 | B1 * | 1/2013 | Tu | H01L 23/3107 | 257/80 |
| 8,564,012 | B2 * | 10/2013 | Ankireddi | G01S 17/026 | 257/100 |
| 8,604,436 | B1 * | 12/2013 | Patel | H03K 17/941 | 250/338.1 |
| 8,674,305 | B2 * | 3/2014 | Rossi | G01S 17/026 | 250/341.8 |
| 8,716,665 | B2 * | 5/2014 | Yao | G01S 7/4813 | 250/338.1 |
| 8,779,361 | B2 * | 7/2014 | Costello | G01D 5/34715 | 250/216 |
| 8,791,489 | B2 * | 7/2014 | Rudmann | H01L 31/12 | 257/81 |
| 8,946,620 | B2 * | 2/2015 | Loong | G01S 17/026 | 250/221 |
| 8,957,380 | B2 * | 2/2015 | Costello | G01S 7/4813 | 250/338.1 |
| 9,063,005 | B2 * | 6/2015 | Rudmann | G01S 17/026 | |
| 9,190,398 | B2 * | 11/2015 | Tu | H01L 31/16 | |
| 9,231,015 | B2 | 1/2016 | Chen et al. | | |
| 9,269,848 | B2 * | 2/2016 | Lermer | H01L 25/167 | |
| 9,383,434 | B2 * | 7/2016 | Bouchilloux | G01S 17/46 | |
| 9,459,352 | B2 * | 10/2016 | Becker | G01S 17/32 | |
| 9,465,442 | B2 * | 10/2016 | Rai | G01S 17/026 | |
| 9,564,569 | B1 * | 2/2017 | Wang | H01L 35/02 | |
| 9,599,745 | B2 * | 3/2017 | Hsu | G01V 8/12 | |
| 9,647,178 | B2 * | 5/2017 | Tu | H01L 33/48 | |
| 2004/0201987 | A1 | 10/2004 | Omata | | |
| 2010/0090235 | A1 | 4/2010 | Wang et al. | | |
| 2013/0334445 | A1 * | 12/2013 | Tharumalingam | H01L 24/97 | 250/552 |
| 2014/0175462 | A1 | 6/2014 | Lermer et al. | | |
| 2014/0197305 | A1 * | 7/2014 | Hsu | G01S 17/026 | 250/208.2 |
| 2014/1097305 | | 7/2014 | Hsu et al. | | |
| 2014/0231635 | A1 * | 8/2014 | Kerness | G01S 17/026 | 250/226 |
| 2014/0340302 | A1 * | 11/2014 | Sengupta | G06F 3/042 | 345/156 |
| 2015/0008329 | A1 * | 1/2015 | Chen | G01J 1/0411 | 250/393 |

FOREIGN PATENT DOCUMENTS

| | | | |
|---|---|---|---|
| CN | 104009030 | A | 8/2014 |
| JP | 2007-317815 | A | 12/2007 |
| TW | 201015755 | A | 4/2010 |
| TW | 201413927 | A | 4/2014 |
| TW | 201428326 | A | 7/2014 |
| TW | 201430664 | A | 8/2014 |
| WO | WO-2008/100298 | A1 | 8/2008 |

OTHER PUBLICATIONS

Office Action and Search Report for corresponding Chinese Patent Application No. 201410673430.X, dated Oct. 26, 2017, 5 pages.
Office Action and Search Report for corresponding Taiwan Patent Application No. 104138599, dated Dec. 15, 2017, 5 pages.
Translation of Search Report for Taiwan Patent Application No. 104138599 dated Dec. 15, 2017, 2 pages.

* cited by examiner

OPTICAL MODULE, MANUFACTURING METHOD THEREOF AND ELECTRONIC APPARATUS

CROSS-REFERENCE TO RELATED PATENT APPLICATIONS

This application claims the benefit of P.R.C. (China) patent application 201410673430.X filed 20 Nov. 2014, the contents of which are incorporated herein by reference in their entirety.

BACKGROUND

1. Field

The present disclosure relates to an optical module, a manufacturing method thereof and an electronic apparatus.

2. Description of the Related Art

An optical module, for example, a proximity sensor, can be used to sense an object near the optical module. The optical module may include a light-emitting component and an optical sensor, where the optical sensor can sense light emitted by the light-emitting component and reflected by an object. By way of example, when the optical module is included within a smartphone, the optical sensor may sense light reflected from a facial surface of a user of the smartphone.

Optical cross talk can cause diminished sensitivity of the optical sensor to desired reflections. In the smartphone example, optical cross talk can cause diminished sensitivity of a proximity sensor to reflections from the facial surface of the user of the smartphone. Optical cross talk may be light emitted by the light-emitting component and reaching the optical sensor directly; cross talk may also be light emitted by the light-emitting component but reaching the optical sensor via reflection from another medium other than the object to be sensed. In the smartphone example, cross talk can include light reflected from objects other than the facial surface of the user, such as reflected from a display screen glass of the smartphone.

A lid including an opaque material may be used to block optical cross talk occurring due to light emitted by the light-emitting component directly reaching a photosensitive region of the optical sensor. However, the photosensitive region may also receive optical cross talk in the form of unwanted reflected light, which may not be blocked by the lid. For the smartphone example, the photosensitive region may receive light reflected from one or both surfaces of the display screen glass, which may account for as much as about 80% of received power.

A distance between the light-emitting component and the optical sensor can be increased, to reduce optical cross talk from unwanted reflected light. However, increasing the distance between the light-emitting component and the optical sensor will increase a size of the optical module, which generally goes against a prevailing trend of decreasing the size of many electronics while adding functionality, such as is the situation for smartphones and other devices.

SUMMARY

An embodiment of the present disclosure relates to an optical module. The optical module includes a substrate, a lid, a light-emitting component, a first sensor and a second sensor. The lid is disposed on a surface of the substrate. The lid defines a first opening, a second opening and a third opening. The second opening is between the first opening and the third opening. The light-emitting component is disposed on the surface of the substrate and in the first opening. The first sensor is disposed on the surface of the substrate and in the second opening. The second sensor is disposed on the surface of the substrate and in the third opening.

An embodiment of the present disclosure relates to a method for manufacturing an optical module. The method includes providing a substrate, and disposing a light-emitting component, a first sensor and a second sensor on a surface of the substrate. The first sensor is positioned between the light-emitting component and the second sensor. The method further comprises disposing a lid on the surface of the substrate, the lid defining a first opening, a second opening and a third opening, such that the first opening is positioned to accommodate the light-emitting component, the second opening is positioned to accommodate the first sensor, and the third opening is positioned to accommodate the second sensor.

An embodiment of the present disclosure relates to an electronic apparatus, including an optical module, the optical module including a substrate, a lid, at least one light-emitting component, at least one first sensor and a second sensor disposed on a surface of the substrate. The lid defines a first opening, a second opening and a third opening, the second opening being between the first opening and the third opening. The light-emitting component is disposed in the first opening, the first sensor is disposed in the second opening, and the second sensor is disposed in the third opening.

DETAILED DISCLOSURE

The present disclosure describes an optical module in which the light-emitting component is separated from the optical sensor by a distance to minimize cross talk. Another sensor (or other component) is positioned between the light-emitting component and the optical sensor, thereby optimizing usage of a space between the light-emitting component and the optical sensor and increasing a functionality of the optical module.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
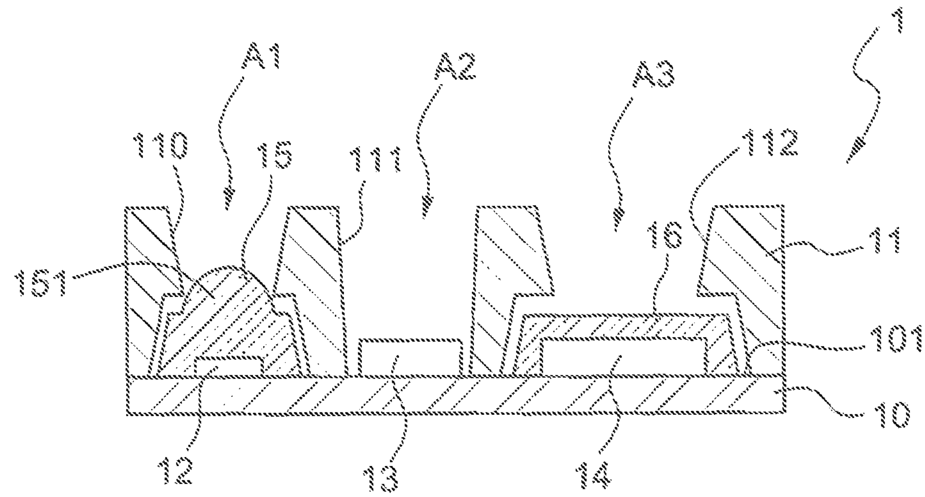
FIG. 1 is a sectional view of an optical module according to an embodiment of the present disclosure.

FIG. 1 is a sectional view of an optical module 1 according to an embodiment of the present disclosure. The optical module 1 includes a substrate 10, a lid 11, at least one light-emitting component 12, at least one first sensor 13, at least one second sensor 14, a first encapsulant 15 and a second encapsulant 16.

The substrate 10 may be, for example, a carrier or a printed circuit board. The substrate may include (not shown in FIG. 1) one or more traces, one or more wire-bonding pads, and/or one or more vias in the substrate 10 or on a surface thereof. The substrate 10 may include, but is not limited to, an organic material, a polymer material, silicon, silicon dioxide or other silicide, or a combination thereof.

The lid 11 is disposed on a surface 101 of the substrate 10. The lid 11 defines a first opening A1, a second opening A2 and a third opening A3, where the second opening A2 is between the first opening A1 and the third opening A3. Each of the first opening A1, the second opening A2 and the third opening A3 extend from a top surface of the lid 11 to the surface 101 of the substrate 10. The lid 11 includes a first sidewall 110 on a portion of the lid defining the first opening A1, a second sidewall 111 on a portion of the lid defining the second opening A2, and a third sidewall 112 on a portion of the lid defining the third opening A3. In the embodiment illustrated in FIG. 1, the second sidewall 111 extends from the top surface of the lid 11 to the surface 101 of the substrate 10, and thus the second sidewall 111 of the lid 11 defines a perimeter of the second opening A2 in this embodiment.

The light-emitting component 12 is disposed on the surface 101 and in the first opening A1. The light-emitting component 12 may be, but is not limited to, a light emitting diode (LED).

The first sensor 13 is disposed on the surface 101 and in the second opening A2. Examples of the first sensor 13 include a micro-electromechanical system (MEMS) sensor, a temperature sensor, a pressure sensor, a humidity sensor, an inertial force sensor, a chemical species sensor, or a magnetic field sensor.

The second sensor 14 is disposed on the surface 101 and in the third opening A3. The second sensor 14 is an optical sensor; for example, a photodiode or an infrared detector.

Portions of the lid 11 between the first opening A1 and the third opening A3 (e.g., a portion of the lid 11 between the first sidewall 110 and the second sidewall 111, and a portion of the lid 11 between the second sidewall 111 and the third sidewall 112) block light emitted by the light-emitting component 12 from directly reaching the second sensor 14.

The first encapsulant 15 covers upper and side surfaces of the light-emitting component 12. In the embodiment of FIG. 1, the first encapsulant 15 includes a lens portion 151 above the light-emitting component 12 to increase light emission efficiency.

The second encapsulant 16 covers upper and side surfaces of the second sensor 14.

The first encapsulant 15 and the second encapsulant 16 each includes a material permeable to light, such as, for example, a transparent epoxy. The material may have, for example, a transparency such that about 90% or greater (e.g., equal to or greater than about 92%, 95%, or 98%) of light within a selected range of wavelengths (e.g., light in the visible range or light in the infrared range) is allowed to pass through the material.

Figure 1A:
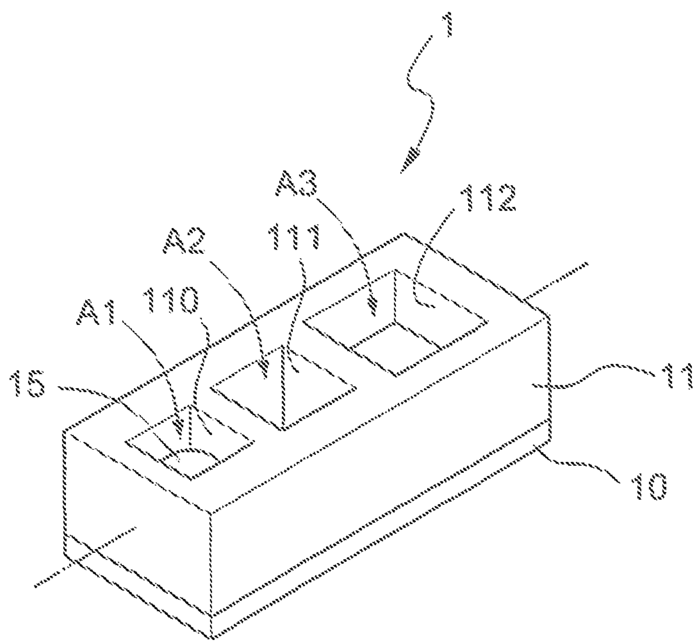
FIG. 1A is a top view of the optical module shown in FIG. 1.

FIG. 1A is a top view of the optical module shown in FIG. 1 according to an embodiment of the present disclosure. FIG. 1A illustrates positioning of the lid 11 of the optical module 1 on the substrate 10. As can be seen in this view, the lid 11 defines the first opening A1, the second opening A2 and the third opening A3.

Figure 2:
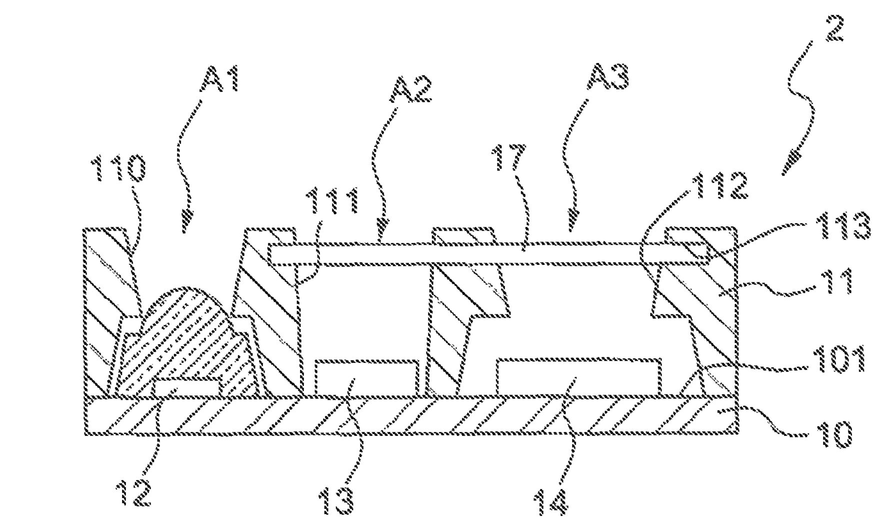
FIG. 2 is a sectional view of an optical module according to an embodiment of the present disclosure.

FIG. 2 is a sectional view of an optical module 2 according to an embodiment of the present disclosure. The optical module 2 of FIG. 2 is similar to the optical module 1 of FIG. 1, except that lid 11 defines a groove 113 in the second sidewall 111 and the third sidewall 112. An optical plate 17 is disposed in the groove 113. The optical plate 17 is permeable to light, and may be, for example, a filter or polarizer made of a glass, a ceramic, a polymer material, a combination thereof, or other light-permeable material. To position the optical plate 17 within the groove 113, the optical plate 17 is positioned within a mold before the lid 11 is formed, so that the optical plate 17 can be located in the groove 113 of the lid 11 when the lid 11 is formed. In one or more embodiments, the optical plate 17 extends across a width (into the plane of the page in the illustration in FIG. 2) of one or both of the second opening A2 and the third opening A3. In other embodiments, the optical plate 17 does not extend across the width of one of, or either of, the second opening A2 and the third opening A3.

Another difference between the optical module 2 of FIG. 2 and the optical module 1 of FIG. 1 is that the optical module 2 does not include the second encapsulant 16. The optical plate 17 of the optical module 2 may protect the second sensor 14 in addition to, or alternatively to, having a filtering and/or polarizing effect, and thus the second encapsulant 16 may be omitted. However, in other embodiments, the optical module 2 does include the second encapsulant 16 (e.g., disposed to cover the second sensor 14 as illustrated in FIG. 1).

In an embodiment in which the first sensor 13 is an ultraviolet sensor and the second sensor 14 is an infrared detector, the optical plate 17 may be a filter that allows ultraviolet light and infrared light to pass. Such a filter may be, for example, a filter made of fused silica.

Figure 3:
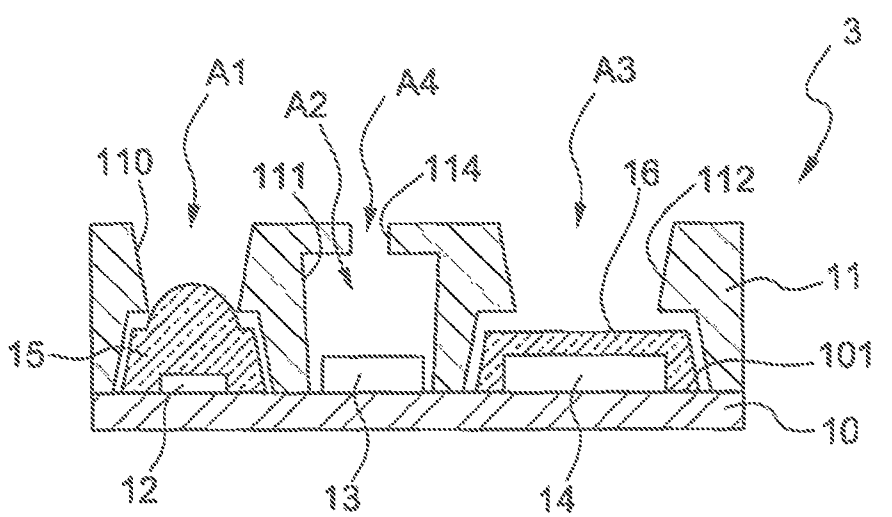
FIG. 3 is a sectional view of an optical module according to an embodiment of the present disclosure.

FIG. 3 is a sectional view of an optical module 3 according to an embodiment of the present disclosure. The optical module 3 of FIG. 3 is similar to the optical module 1 of FIG. 1, except that a protrusion 114 is included on the lid 11 above the second opening A2. The protrusion 114 extends from a top of the second sidewall 111 towards a center of the second opening A2 such that the protrusion 114 defines an aperture A4, where a size (e.g., a diameter) of aperture A4 is significantly less than a size (e.g., a diameter) of the second opening A2, such as no greater than about 50%, no greater than about 40%, or no greater than about 30% of the diameter of A2.

In one or more embodiments, the protrusion 114 is integrally formed with a portion of the lid 11, or is integrally formed with the entire lid 11. In one or more embodiments, the protrusion 114 is of a same material as the lid 11, or a same material as a portion of the lid 11. In other embodiments, the protrusion 114 and the lid 11 include different materials.

The protrusion 114 may provide protection for the first sensor 13 located therebelow. In embodiments in which the first sensor 13 is a pressure sensor or a gas sensor, the aperture A4 allows for gas circulation to permit the first sensor 13 to sense ambient air pressure or ambient gas content.

Figure 4:
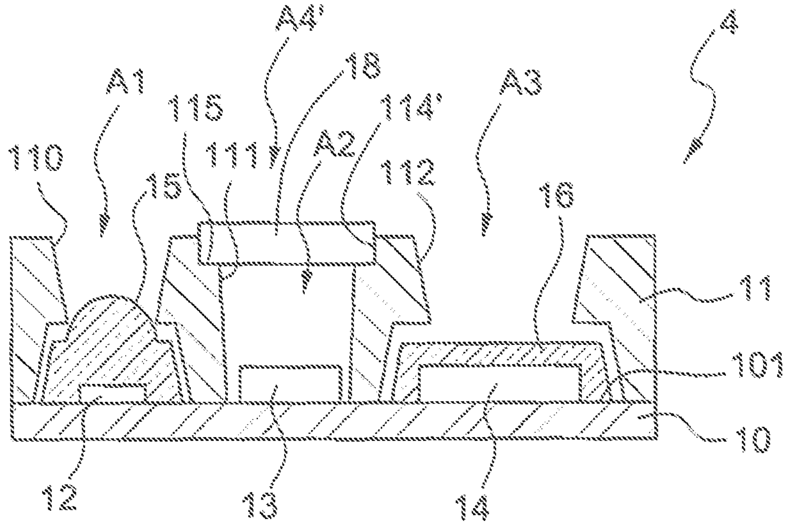
FIG. 4 is a sectional view of an optical module according to an embodiment of the present disclosure.

FIG. 4 is a sectional view of an optical module according to an embodiment of the present disclosure. The optical module 4 of FIG. 4 is similar to the optical module 1 of FIG. 1, except that a recess 114' is included in the lid 11 within the second opening A2, in the second sidewall 111. The lid 11 at the recess 114' defines an aperture A4' spanning and extending beyond a perimeter the second opening A2, such that a size (e.g., a diameter) of the aperture A4' is greater than the size (e.g., a diameter) of the second opening A2. The recess 114' includes a support portion 115.

Another difference between the optical module 4 of FIG. 4 and the optical module 1 of FIG. 1 is that the optical module 4 includes a protection structure 18 extending across the aperture A4' and disposed on the support portion 115 of the recess 114'. The protection structure 18 may include, but is not limited to, material such as a metal, a glass, a polymer, or a combination thereof. In embodiments in which the first sensor 13 is an ultraviolet sensor, the protection structure 18 may include a material such as a polymer or a silica gel, to protect the first sensor 13 and to allow ultraviolet light to pass through the protection structure 18.

In one or more embodiments, the protection structure 18 may have an aperture (not shown) to facilitate operation of the first sensor 13, such as if the first sensor 13 is a gas sensor or a pressure sensor.

Figure 5:
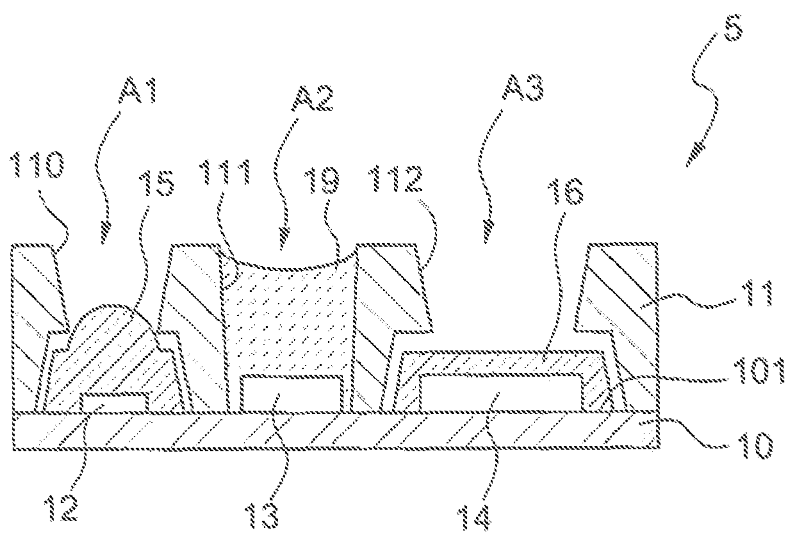
FIG. 5 is a sectional view of an optical module according to an embodiment of the present disclosure.

FIG. 5 is a sectional view of an optical module 5 according to an embodiment of the present disclosure. The optical module 5 of FIG. 5 is similar to the optical module 1 of FIG. 1, except that the optical module 5 includes a third encapsulant 19 disposed within the second opening A2 and covering the upper and side surfaces of the first sensor 13. The third encapsulant 19 may include the same or different materials as the first encapsulant 15 or the second encapsulant 16. In one or more embodiments, such as embodiments in which the first sensor 13 is a pressure sensing chip, the third encapsulant 19 may be a material with elasticity, to allow the pressure sensing chip to sense ambient pressure. In one or more embodiments, such as embodiments in which the first sensor 13 is an ultraviolet sensor, the third encapsulant 19 may be transparent to ultraviolet light. In one or more embodiments, the third encapsulant 19 includes silica gel, which includes properties of elasticity and transparency to ultraviolet light.

In one or more embodiments (e.g., as illustrated in FIG. 1, FIG. 2, FIG. 3, FIG. 4 or FIG. 5, or in other embodiments), the lid 11 may be affixed to the substrate 10 with an adhesive (not shown). In one or more embodiments, the adhesive is light-blocking. For example, a black epoxy may be used to affix the lid 11 to the substrate 10, and/or to close gaps between the lid 11 and the substrate 10 to prevent leakage of light from the light-emitting component 12 to the first sensor 13 or the second sensor 14. In one or more embodiments in which the lid 11 is affixed to the substrate 10, a light-blocking adhesive is used to close a gap between the lid 11 and the substrate 10 and is thus the adhesive is disposed exclusively around a perimeter of the second opening A2 at a base of the second sidewall 111, and is omitted from other portions of the lid 11. In other embodiments, the adhesive is disposed exclusively at a bottom of the opening A1, or exclusively at a bottom of the opening A2, or at the bottom of the opening A1 and at the bottom of the opening A2. Other positioning of the adhesive is within the scope of the present disclosure.

When an adhesive is used to affix the lid 11 to the substrate 10, the adhesive may overflow upwards into the first opening A1, the second opening A2 and/or the third opening A3. In embodiments in which the first sensor 13 is not protected from such overflow (e.g., as illustrated in FIG. 1, FIG. 2, FIG. 3 or FIG. 4, or in other embodiments), the adhesive may contact the first sensor 13 and may affect operation of, or a sensing efficiency of, the first sensor 13. One technique to prevent the adhesive from contacting the first sensor 13 is to provide additional space for the adhesive to spread. One such technique is illustrated in FIG. 6.

Figure 6:
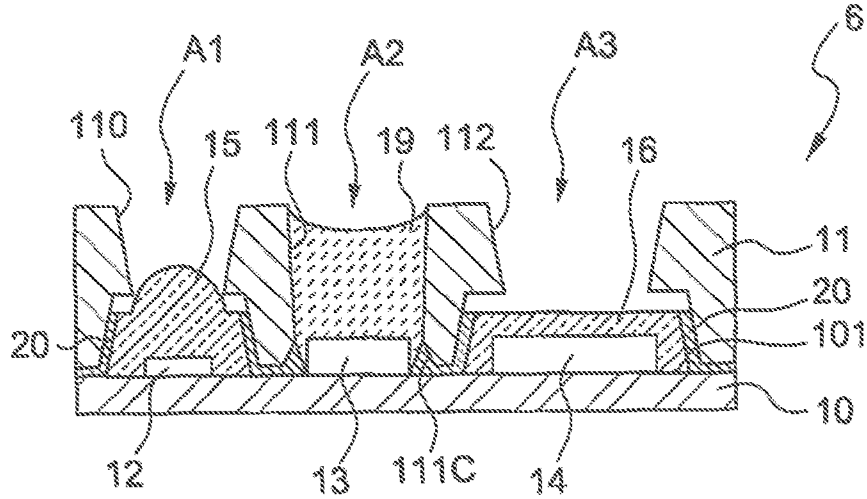
FIG. 6 is a sectional view of an optical module according to an embodiment of the present disclosure.

FIG. 6 is a sectional view of an optical module 6 according to another embodiment of the present disclosure. The optical module 6 of FIG. 6 is similar to the optical module 5 of FIG. 5, except that an adhesive 20 is used to affix the lid 11 onto the substrate 10, and the base of the second sidewall 111 of the lid 11 of the optical module 5 includes a chamfer 111C. The chamfer 111C increases a space between the base of the second sidewall 111 and the substrate 10 to accommodate the adhesive 20, thereby reducing overflow of the adhesive 20 to avoid contact of the adhesive 20 with the first sensor 13. Further, the increased space may provide for an increased volume of adhesive, and/or an increased area of contact of the adhesive 20 and the lid 11, so that the lid 11 is more tightly affixed to the substrate 10 or so that gaps between the lid 11 and the substrate 10 are minimized or eliminated.

Figure 6A:
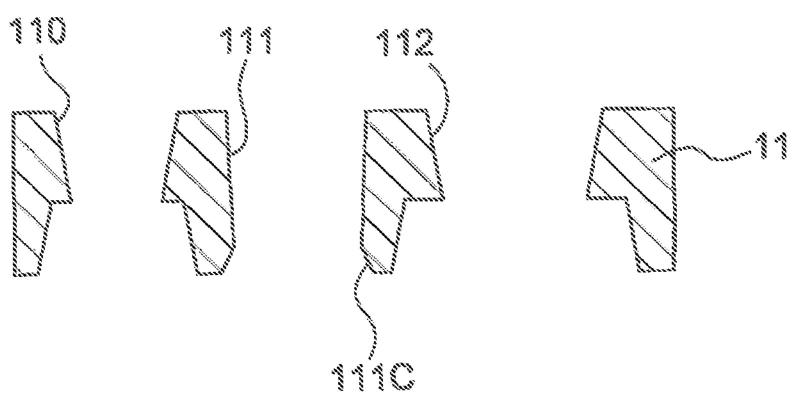
FIG. 6A is a sectional view of the lid shown in FIG. 6.

FIG. 6A is a sectional view of the lid 11 of FIG. 6, showing more clearly the chamfer 111C at the base of the second sidewall 111.

Figure 7:
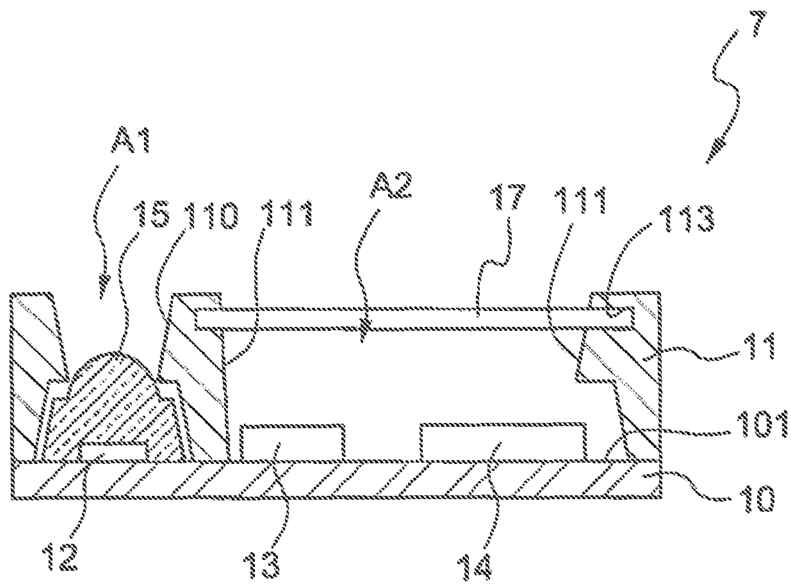
FIG. 7 is a sectional view of an optical module according to an embodiment of the present disclosure.

FIG. 7 is a sectional view of an optical module 7 according to an embodiment of the present disclosure. The optical module 7 of FIG. 7 is similar to the optical module 2 of FIG. 2, except that the optical module 7 omits the portion of the lid 11 between the second opening A2 and the third opening A3, such that the first sensor 13 and the second sensor 14 are disposed within the second opening A2, and the third opening A3 is not separately defined (the third opening A3 is encompassed within the second opening A2).

Figure 8A:
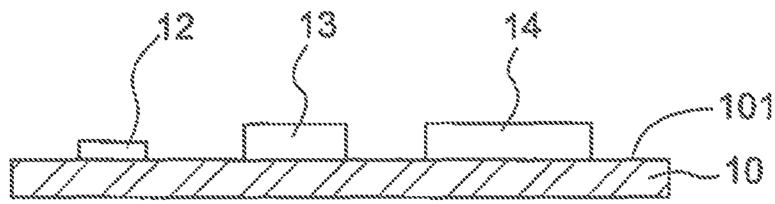
FIGS. 8A, 8B, 8C and 8D illustrate a method of manufacturing an optical module according to an embodiment of the present disclosure.

FIGS. 8A-8D illustrate a method of manufacturing an optical module according to an embodiment of the present disclosure. Referring to FIG. 8A, a substrate 10 is provided. At least one light-emitting component 12, at least one first sensor 13, and at least one second sensor 14 are disposed on a surface 101 of the substrate 10. The first sensor 13 is positioned between the light-emitting component 12 and the second sensor 14.

Figure 8B:
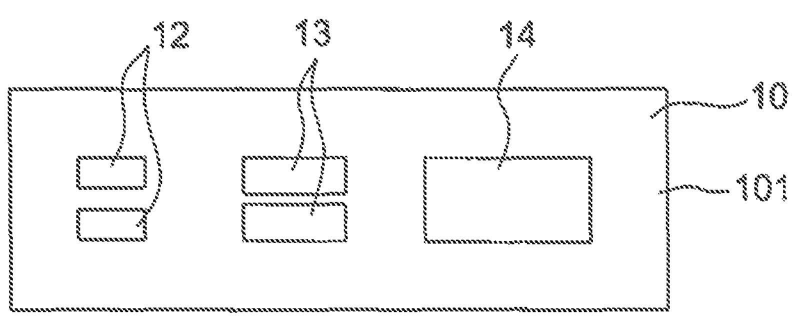

FIG. 8B is a top view of FIG. 8A according to an embodiment of the present disclosure. In the embodiment of FIG. 8B, two light-emitting components 12, two first sensors 13 and a second sensor 14 are disposed on the surface 101 of the substrate 10, where the sensors 13 are positioned between the light-emitting components 12 on one side and the second sensor 14 on the other side.

Although FIG. 8B is illustrated with two light-emitting components 12, in some embodiments, there is one light-emitting component 12, or there are more than two light-emitting components 12. In one or more embodiments, the light-emitting components 12 may be in one device (e.g., one chip) or in separate devices. Further, the light-emitting components 12 may be similar, or may be of different types. For example, one light-emitting component 12 may be a red light emitting diode (LED), and another other light-emitting component 12 may be an infrared LED.

Although FIG. 8B is illustrated with two first sensors 13, in other embodiments there is one first sensor 13 or there are more than two first sensors 13. In one or more embodiments, the first sensors 13 may be in one device or in separate devices. Further, the first sensors 13 may be similar, or may be of different types.

Although FIG. 8B is illustrated with one second sensor 14, in other embodiments there is more than one second sensor 14. In one or more embodiments, the second sensors 14 may be in one device or in separate devices. Further, the second sensors 14 may be similar, or may be of different types.

Figure 8C:
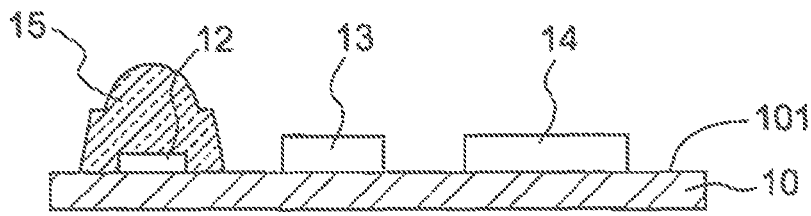

Referring to FIG. 8C, a first encapsulant 15 is disposed to cover upper and side surfaces of the light-emitting component(s) 12.

Figure 8D:
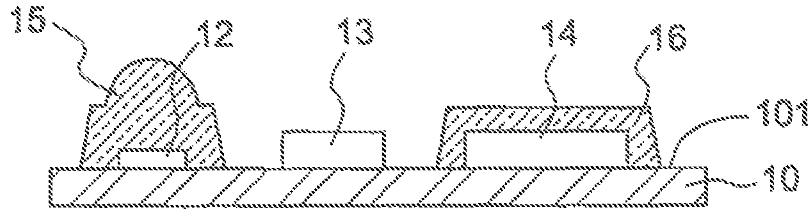

Referring to FIG. 8D, a second encapsulant 16 is disposed to cover upper and side surfaces of the second sensor(s) 14.

According to an embodiment of the present disclosure, the second encapsulant 16 is disposed prior to disposing the first encapsulant 15. According to an embodiment of the present disclosure, the first encapsulant 15 and the second encapsulant 16 are disposed in a same process stage.

At a stage subsequent to FIG. 8D, a lid 11 may be disposed on the substrate 10 to form an optical module such as shown in FIG. 1, 3, 4, 5 or 6.

For the embodiments of FIGS. 5 and 6, subsequent to disposing the lid 11 on the substrate 10, a third encapsulant 19 is disposed in the second opening A2, such as by using a dispensing technology, to cover upper and side surfaces of the first sensor(s) 13. An advantage of using a dispensing technology is that the third encapsulant 19 may be selectively applied to some optical modules and not to others, depending on the type of the first sensor(s) 13, without developing separate molds (e.g., one mold including a section for the third encapsulant 19 and another mold not including a section for the third encapsulant 19).

In sum, embodiments of the present disclosure set forth an improved structural design of a multi-function optical module, so that, when a distance between a light-emitting component (e.g., the light-emitting component 12) and an optical sensor (e.g., the second sensor 14) is increased to reduce cross talk, a sensor (or other component) with a different function may be positioned between the light-emitting component and the optical sensor to utilize the available space. In other words, embodiments of the present disclosure set forth an integrated optical module with reduced cross talk and increased functionality (e.g., additional types of sensors) as compared to single-function optical modules.

Figure 9A:
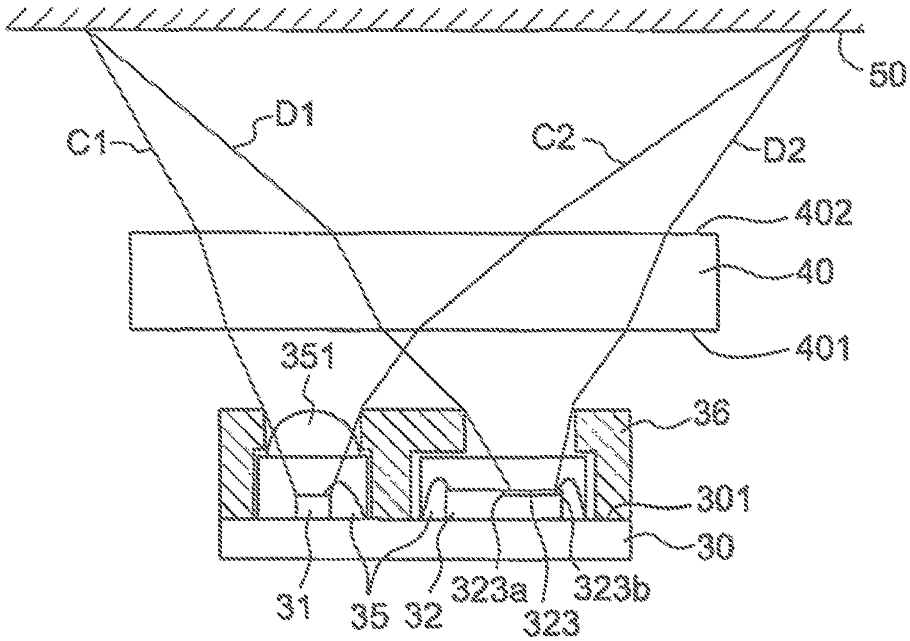
FIG. 9A is a sectional view of an optical module.
Figure 9B:
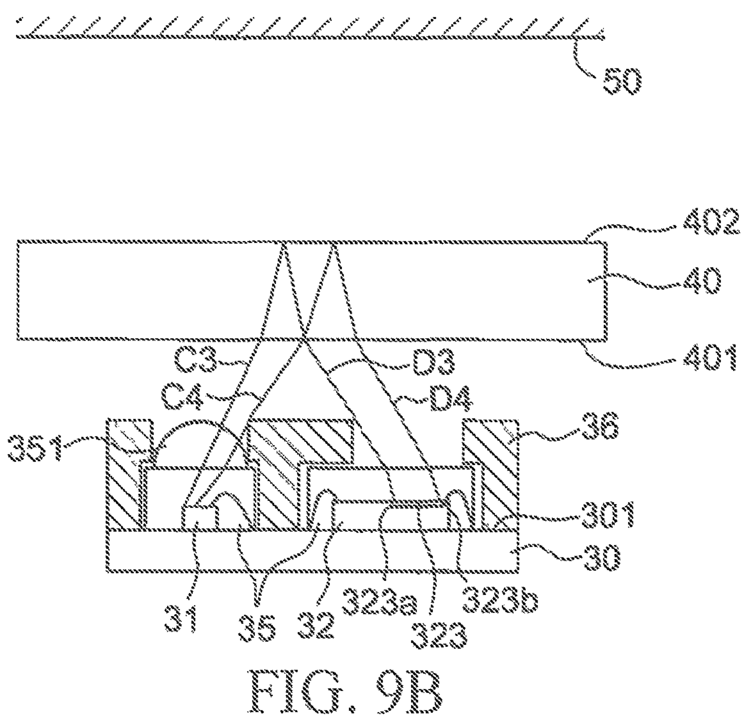
FIG. 9B is a sectional view of an optical module.
Figure 10:
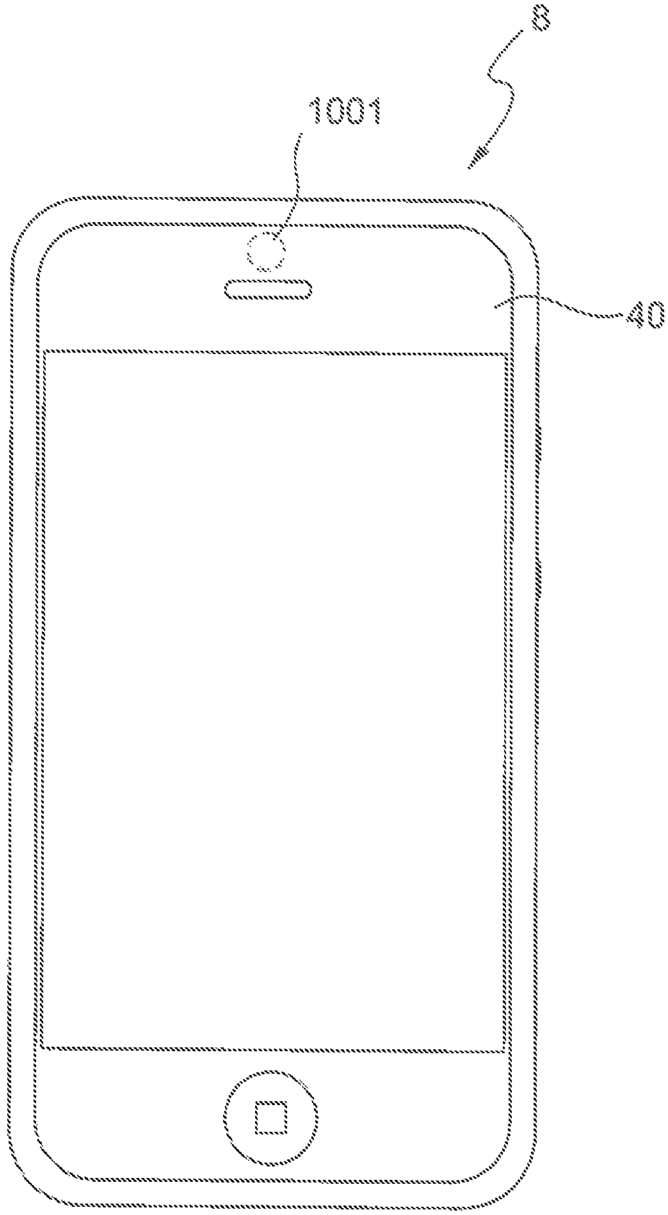
FIG. 10 is a view of an electronic apparatus including an optical module according to an embodiment of the present disclosure.

FIGS. 9A, 9B and 10 illustrate an impetus for an increased distance between the light-emitting component and the optical sensor. Referring to FIG. 9A, a lid 36 of an optical module prevents light emitted by a light-emitting component 31 from directly reaching a photosensitive region 323 of an optical sensor 32. Referring still to FIG. 9A, light (e.g., in a range between C1 and C2) may be reflected by an object 50 (e.g., reflected as light within the range between D1 and D2), and the reflected light may be received by the photosensitive region 323 of the optical sensor 32. However, when used in a product such as a smartphone 8 of FIG. 10, with glass 40, light may also be reflected by a first surface 401 and/or a second surface 402 of the glass 40 (FIG. 9B, e.g., light in a range between C3 and C4 reflected as light in a range between D3 and D4), and may be received as optical cross talk by the photosensitive region 323. For example, in the optical module shown in FIGS. 9A and 9B, up to about 80% of received power is from optical cross talk.

Although examples have been described with respect to a smartphone, embodiments of the present disclosure may be used in other products, such as watches or handheld computers.

Referring again to FIG. 10, an example of a position of an optical module (e.g., optical module 1, 2, 3, 4, 5, 6 or 7 of respective FIG. 1, 2, 3, 4, 5, 6 or 7) within the smartphone 8 is illustrated in dotted line by reference number 1001. Other positioning is also encompassed by the present disclosure.

As used herein, the terms "substantially," "substantial," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An optical module, comprising:

a substrate;

a lid disposed on a surface of the substrate, the lid defining a first opening, a second opening and a third opening, wherein the second opening is between the first opening and the third opening;

at least one light-emitting component disposed on the surface of the substrate and in the first opening;

at least one first sensor disposed on the surface of the substrate and in the second opening at least one second sensor disposed on the surface of the substrate and in the third opening;

a first encapsulant disposed in the first opening and covering upper and side surfaces of the at least one light-emitting component, wherein the first encapsulant is separated from a first sidewall of the first opening by a space; and a third encapsulant disposed in the second opening and covering upper and side surfaces of the at least one first sensor, wherein the third encapsulant contacts a second sidewall of the second opening.

2. The optical module according to claim 1, wherein the lid comprises the first sidewall within the first opening, the second sidewall within the second opening, and a third sidewall within the third opening, and wherein the lid defines a groove in the second sidewall and the third sidewall.

3. The optical module according to claim 2, further comprising an optical plate disposed in the groove.

4. The optical module according to claim 1, wherein the lid comprises the first sidewall within the first opening, the second sidewall within the second opening, and a third sidewall within the third opening, and wherein the lid includes a chamfer at a base of the second sidewall.

5. The optical module according to claim 4, further comprising an adhesive disposed at the base of the second sidewall along the chamfer, wherein the adhesive is disposed between the lid and the substrate.

6. The optical module according to claim 1, wherein the lid comprises a protrusion at a top of the second opening, the protrusion defines an aperture, and a size of the aperture is less than a size of the second opening.

7. The optical module according to claim 1, wherein the lid comprises the first sidewall within the first opening, the second sidewall within the second opening, and a third sidewall within the third opening, and wherein the lid further defines a recess in the second sidewall, and the recess defines an aperture spanning and extending beyond a perimeter of the second opening, such that a size of the aperture is greater than a size of the second opening.

8. The optical module according to claim 7, further comprising a protection structure disposed above the first sensor.

9. The optical module according to claim 8, wherein the recess comprises a support portion and the protection structure is positioned on the support portion.

10. The optical module according to claim 1, wherein the first, second and third openings are arranged in a row.

11. The optical module according to claim 1, wherein the second sensor is an optical sensor.

12. The optical module according to claim 11, wherein a distance between the light-emitting component and the second sensor is greater than a distance between the light-emitting component and the first sensor, and the distance between the light-emitting component and the second sensor is greater than a distance between the first sensor and the second sensor.

13. The optical module according to claim 1, wherein the first sensor in the second opening is a non-optical sensor.

14. The optical module according to claim 13, wherein the non-optical sensor is a micro-electromechanical system (MEMS) sensor, a temperature sensor, a pressure sensor, a humidity sensor, an inertial force sensor, a chemical species sensor, or a magnetic field sensor.

15. The optical module according to claim 1, further comprising a second encapsulant disposed in the third opening and covering upper and side surfaces of the at least one second sensor, wherein the second encapsulant is separated from a third sidewall of the third opening by a space.

16. The optical module according to claim 15, the first encapsulant and the second encapsulant are permeable to light.

17. The optical module according to claim 15, wherein a material of the third encapsulant is different from a material of the first encapsulant or a material of the second encapsulant.

18. An electronic apparatus comprising an optical module, the optical module comprising:

a substrate having a surface;

a lid disposed on the surface of the substrate, the lid defining a first opening, a second opening and a third opening, the second opening being between the first opening and the third opening;

at least one light-emitting component disposed on the surface of the substrate and in the first opening;

at least one first sensor disposed on the surface of the substrate and in the second opening at least one second sensor disposed on the surface of the substrate and in the third opening;

a first encapsulant disposed in the first opening and covering upper and side surfaces of the at least one light-emitting component, wherein the first encapsulant is separated from a first sidewall of the first opening by a space; and a third encapsulant disposed in the second opening and covering upper and side surfaces of the at least one first sensor, wherein the third encapsulant contacts a second sidewall of the second opening.

19. The electronic apparatus according to claim 18, wherein the lid comprises the first sidewall within the first opening, the second sidewall within the second opening, and a third sidewall within the third opening, and wherein the lid includes a chamfer at a base of the second sidewall.

20. The electronic apparatus according to claim 19, further comprising an adhesive disposed at the base of the second sidewall along the chamfer, wherein the adhesive is disposed between the lid and the substrate.

21. The electronic apparatus according to claim 18, wherein the lid comprises a protrusion at a top of the second opening, the protrusion defines an aperture, and a size of the aperture is less than a size of the second opening.

22. The electronic apparatus according to claim 18, wherein the lid comprises the first sidewall within the first opening, the second sidewall within the second opening, and a third sidewall within the third opening, and wherein the lid further defines a recess in the second sidewall, and the recess defines an aperture spanning and extending beyond a perimeter of the second opening, such that a size of the aperture is greater than a size of the second opening.

23. The electronic apparatus according to claim 18, wherein the second sensor is an optical sensor.

24. The electronic apparatus according to claim 23, wherein a distance between the light-emitting component and the second sensor is greater than a distance between the light-emitting component and the first sensor, and the distance between the light-emitting component and the second sensor is greater than a distance between the first sensor and the second sensor.

25. The electronic apparatus according to claim 18, wherein the first sensor in the second opening is a non-optical sensor.

26. The electronic apparatus according to claim 18, further comprising a second encapsulant disposed in the third opening and covering upper and side surfaces of the at least one second sensor, wherein the second encapsulant is separated from a third sidewall of the third opening by a space.

27. The electronic apparatus according to claim 26, wherein the first encapsulant and the second encapsulant are permeable to light.

28. The electronic apparatus according to claim 26, wherein a material of the third encapsulant is different from a material of the first encapsulant or the second encapsulant.

* * * * *